United States Patent [19]

Tachikawa et al.

[11] 4,431,725
[45] Feb. 14, 1984

[54] LIGHT-SENSITIVE MATERIAL AND IMAGE FORMING PROCESSES USING THE SAME

[76] Inventors: Hiromichi Tachikawa; Yohnosuke Takahashi; Fumiaki Shinozaki; Tomoaki Ikeda, all of No. 105, Oaza Mizonuma, Asaka-shi, Saitama, Japan

[21] Appl. No.: 399,583

[22] Filed: Jul. 19, 1982

Related U.S. Application Data

[63] Continuation of Ser. No. 107,961, Dec. 28, 1979, abandoned.

[30] Foreign Application Priority Data

Dec. 28, 1978 [JP] Japan ........................................ 54-77

[51] Int. Cl.³ .............................................. G03C 1/58
[52] U.S. Cl. ................................. 430/325; 430/326; 430/191; 430/146; 430/147; 430/328; 430/330
[58] Field of Search ............... 430/191, 325, 326, 146, 430/147, 149, 330, 328

[56] References Cited

U.S. PATENT DOCUMENTS 3,650,756  3/1972  Ohlschlager et al. ............... 430/191

FOREIGN PATENT DOCUMENTS 1442934   7/1976  United Kingdom ................ 430/191
1492620  11/1977  United Kingdom ................ 430/325
1494640  12/1977  United Kingdom ................ 430/325

*Primary Examiner*—Won H. Louie, Jr.

[57] ABSTRACT

A light-sensitive material having on a support a light-sensitive layer containing an o-quinonediazide compound as a main component and, additionally, a particular compound represented by the following general formula (I):

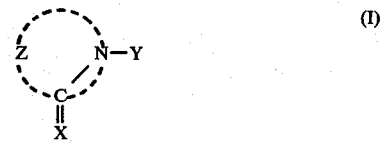

wherein Z represents the nonmetallic atoms forming a 5-membered ring; X represents S, O,

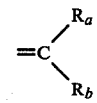

or $=$N—$R_c$ (where $R_a$, $R_b$ and $R_c$ are each hydrogen atom or an organic group other than a carboxylic acid group); and Y is a hydrogen atom or an organic group other than a carboxylic acid group, is disclosed. This material can provide both positive and negative working images having high resolution and good adhesiveness to the support. A process for producing positive working images includes the steps of imagewise exposure and development processing, while a process for producing negative working images includes the steps of imagewise exposure, heating, uniform (overall) exposure and development processing. The same conditions regarding imagewise exposure and development processing, respectively, can be applied to both processes.

7 Claims, No Drawings

LIGHT-SENSITIVE MATERIAL AND IMAGE FORMING PROCESSES USING THE SAME

This is a continuation of application Ser. No. 107,961 filed Dec. 28, 1979, abandoned.

BACKGROUND OF THE INVENTION

1. Field of the Invention

The present invention relates to a light-sensitive material containing an o-quinonediazide compound, and to processes for forming positive working images and negative working images, respectively, using that light-sensitive material.

2. Description of the Prior Art

It is common knowledge that when irradiated with actinic radiation, o-quinonediamide compounds are converted into carboxyl group-containing compounds through photolysis of the diazo groups contained therein and consequently becomes soluble in alkaline solutions. Therefore, when light-sensitive materials containing o-quinonediazide compounds are subjected to imagewise exposure and subsequent development-processing using alkaline developing solutions, the exposed portions dissolve in the developing solution and are eliminated and, at the same time, the unexposed portions remain. Namely, positive working images are formed.

On the other hand, light-sensitive materials which have light-sensitive layers consisting of compositions, which contain o-quinonediazide compounds as light-sensitive components and, additionally, secondary amines, tertiary amines or hydroxy group-containing compounds are described in, for example, Japanese Patent Application (OPI) Nos. 127615/74 (British Patent 1,494,640) and 108002/75 (British Patent 1,492,620) (the term "OPI" as used herein refers to a "published unexamined Japanese patent application"). Such materials by analogy to the above-described materials are positive working. They can produce positive images by imagewise exposure and subsequent development-processing. In addition, they can also work negatively when subjected to imagewise exposure and simultaneously or subsequently to uniform (overall) exposure to light and then to a developing treatment. As described above, secondary amines and tertiary amines in addition to o-quinonediazide compounds have been employed in known light-sensitive materials. Specific examples of such tertiary amines include aliphatic amines such as tributylamine, triamylamine, etc., and hydroxyl group-containing amines such as diethanolamine, N-methylethanolamine, triethanolamine, etc.

SUMMARY OF THE INVENTION

It is an object of the present invention to provide light-sensitive materials which can work to provide both positive and negative images through the use of compounds other than the aforementioned secondary amines and tertiary amines and that can exhibit extremely high resolution, can produce resist films having good adhesion and further have light-sensitive layers excellent in storage stability.

The above objects of the present invention are attained with a light-sensitive material which contains an o-quinonediazide compound and a compound represented by the formula (I) which reacts directly or catalytically with the photochemical reaction products of the o-quinonediazide compound:

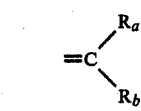

(I)

wherein Z represents the nonmetallic atoms forming a 5-membered ring; X represents S, O,

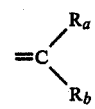

or $=N-R_c$ where $R_a$, $R_b$ and $R_c$ are each a hydrogen atom or an organic group other than a carboxylic acid group; and Y is a hydrogen atom or an organic group other than a carboxylic acid group.

A further object of the present invention is achieved by subjecting the above-described light-sensitive material to imagewise exposure and then, in the case of a positive working process, to a developing treatment and, in the case of a negative working process, to heating and uniform exposure treatments and finally, to a development treatment. In addition, the light-sensitive material of the present invention makes it possible to receive imagewise exposure under the same conditions in both the positive working and negative working processes and that also makes it possible to development-process under the same conditions in both cases.

DETAILED DESCRIPTION OF THE INVENTION

The light-sensitive layer, which is the most characteristic element of the light-sensitive material of the present invention, comprises a light-sensitive o-quinonediazide compound, which is the essential component and a compound represented by the formula (I) above.

o-Quinonediazide compounds suitable for use in the present invention contain at least one o-quinonediazido group. When these compounds are irradiated with actinic radiation, their solubilities in alkaline solutions increase. There are a wide variety of o-quinonediazide compounds. For instance, see, J. Kosar, *Light-Sensitive Systems*, John Wiley & Sons, Inc., which illustrates such compounds in detail. In particular, o-benzo- and o-naphtho-quinonediazidosulfonic acid esters of various hydroxy compounds are favorably employed in the present invention. Specific examples of such esters include 2,2'-dihydroxydiphenyl-bis[naphthoquinone-1,2-diazido-5-sulfonic acid ester], 2,2',4,4'-tetrahydroxydiphenyl-tetra[naphthoquinone-1,2-diazido-5-sulfonic acid ester], 2,3,4-trioxybenzophenone-bis[naphthoquinone-1,2-diazido-5-sulfonic acid ester] and the like. Of such esters, naphthoquinone-1,2-diazido-5-sulfonic acid ester of polyhydroxyphenyl obtained by condensation polymerization of acetone and pyrogallol, which is described in Japanese Patent Publication No. 28403/68 (U.S. Pat. No. 3,635,709), is employed to particular advantage.

On the other hand, the compounds represented by the above formula (I) may have various structures. The 5-membered ring formed by Z may comprise a hetero atom (e.g., an oxygen, sulfur or nitrogen atom) at the position adjacent the $C=X$ group. Representative examples of the 5-membered rings formed by Z include 1,3-oxazolane, Δ⁴-1,3-oxazoline, 1,3-oxathiolane, 1-thia-3-azaindane, Δ⁴-1,3-thiazoline, Δ²-1,3,4-thiadiazoline, imidazoline, benzo[d]imidazoline, pyrrolidine, benzo[b]pyrroline, pyrazolidine, 2-pyrazoline, 3-pyrazoline, 1-oxa-3-azaindane, etc. These rings may be substituted by, for example, a methyl group, an ethyl group, a propyl group, a phenyl group, a benzyl group, an amino group, a carbamoylmethylthio ($NH_2COCH_2S-$) group, a p-(dimethylamino)phenyl group, a benzylidene group, or an oxo group. Of these rings those specifically illustrated in formulae (Ia) to (It) below are preferred.

Y in the formula (I) and $R_a$, $R_b$ and $R_c$ may be any organic group as long as they are not a carboxylic acid group. For example, these groups may be a hydrogen atom, an alkyl group having 1 to 5 carbon atoms, which may be straight or branched chain (e.g., methyl, ethyl, or propyl); a hydroxyalkyl group having 1 to 5 carbon atoms (e.g., a hydroxyethyl group); an aryl group (e.g., a phenyl group or a naphthyl group); a substituted aryl group, in which the aryl moiety thereof may be a phenyl group or a naphthyl group which may be substituted by a nitro group or an alkyl group (e.g., a methyl group, an ethyl group or a propyl group); an aralkyl group (e.g., a benzyl group or a phenethyl group); a pyridyl group; a pyridylmethyl group; a piperidinomethyl group; a morpholinomethyl group; an amino group; a disubstituted amino group (e.g., a dimethylamino group a diethylamino group or a methyl(5-methyl-2-thioxo-1,3-oxazolon-4-ylmethyl)amino group); or an amido group (e.g., an acetamido group). The Y groups specifically illustrated in the compounds listed below are preferred.

Specific examples of the compounds of the formula (I) are illustrated below where they are classified according to skeleton structure. Y in the structural formulae represents an organic group other than carboxylic acid as in the formula (I), and $R_1$, $R_2$, $R_3$ and $R_4$ in each formula represent a hydrogen atom, or an organic group such as an alkyl group or a phenyl group, or an oxo group.

Formula (Ia):

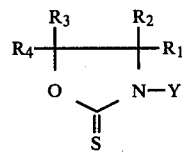

Examples:

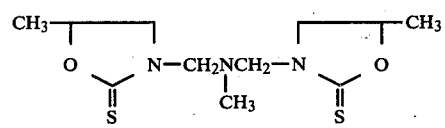

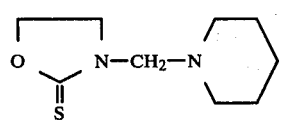

Formula (Ib):

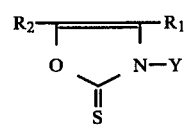

Example:

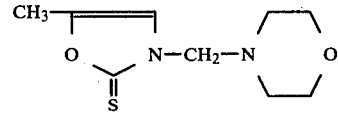

Formula (Ic):

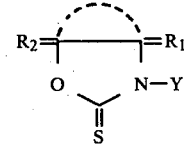

Examples:

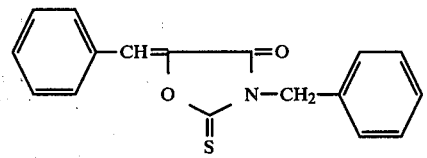

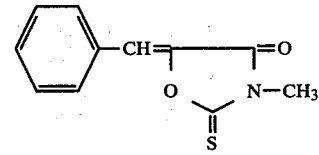

Formula (Id):

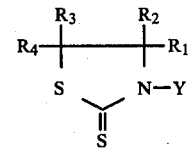

Example

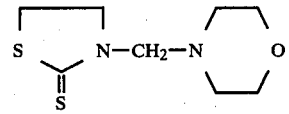

Formula (Ie):

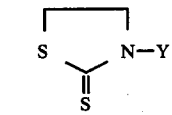

Examples:

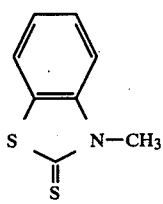

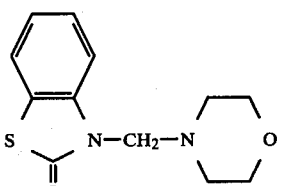

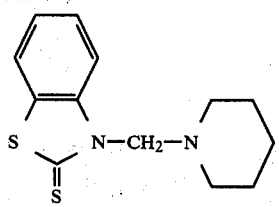
Formula (If):
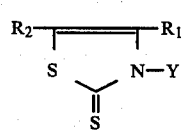
Examples:
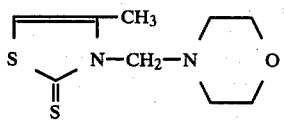
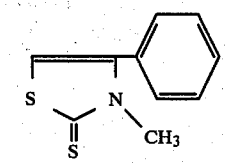
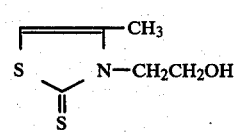
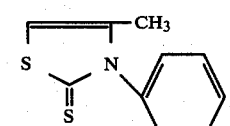
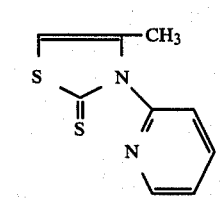
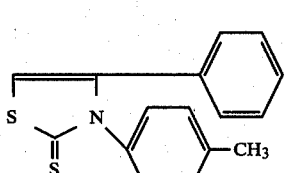
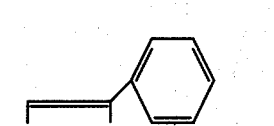
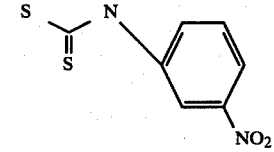
Formula (Ig):
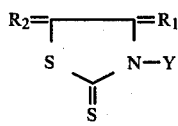
Examples:
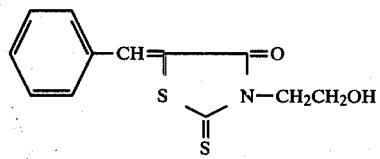
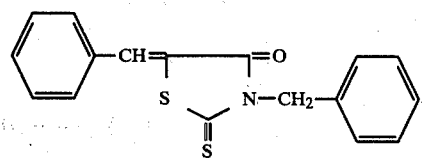
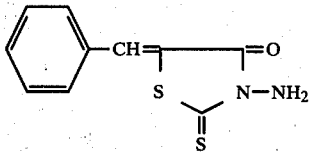
Formula (Ih):
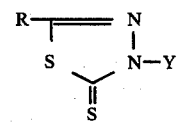
Examples:
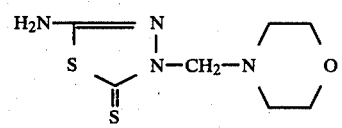
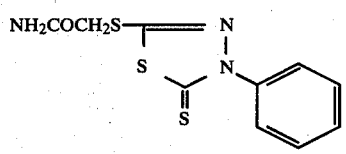
Formula (Ii):
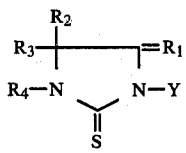
Example:
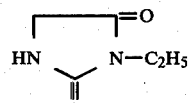
Formula (Ij):
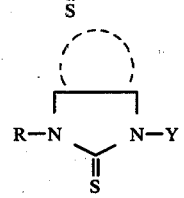

Examples:
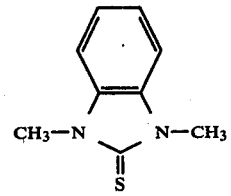
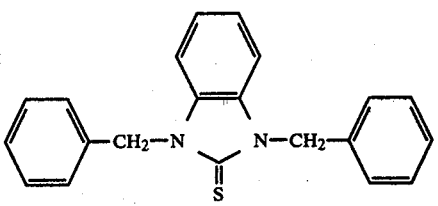
Formula (Ik):
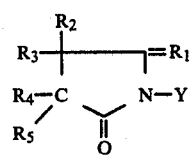
Example:
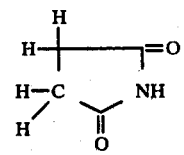
Formula (Il):
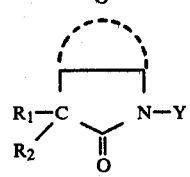
Example:
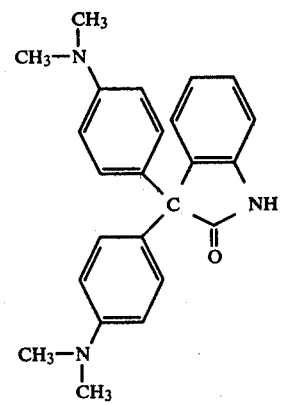
Formula (Im):
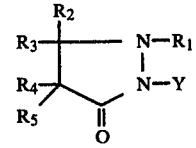
Example:
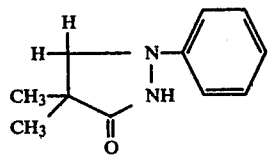
Formula (In):
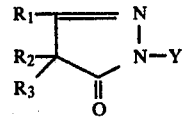
Example:
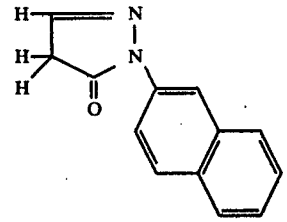
Formula (Io):
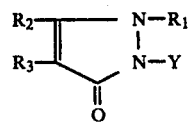
Example:
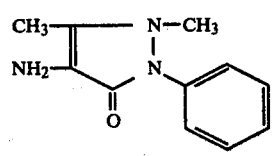
Formula (Ip):
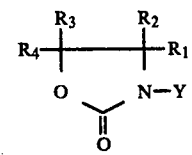
Example:
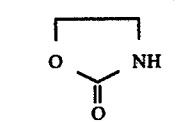
Formula (Iq):
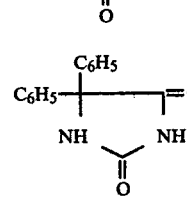
Examples:
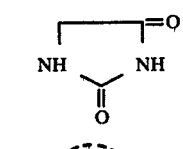
Formula (Ir):
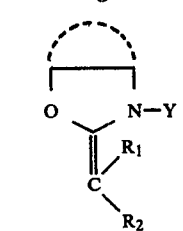

Example:

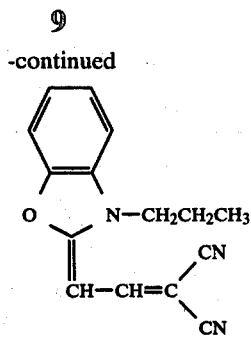

Formula (Is):

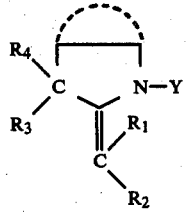

Example:

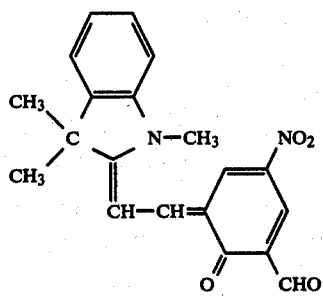

Formula (It):

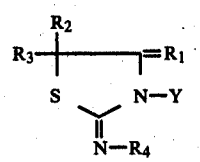

Examples:

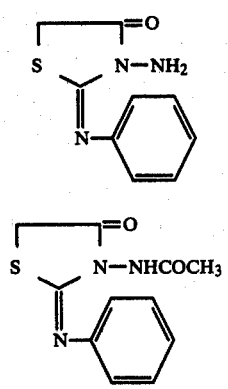

The compounds having the above-described formula (I) can be used independently or in combination. A preferred amount of the compound is about 0.005 part by weight to about 1 part by weight and more preferably about 0.01 part by weight to about 0.3 part by weight per part by weight of the o-quinonediazide compound.

Various additives can be added to the light-sensitive resin compositions employed in the processes of the present invention in addition to the above-described components. For instance, pigments such as Phthalocyanine Blue, and various dyes such as Malachite Green, Safranine, etc., can be used for the purpose of clarifying the images formed. Resins homogeneously miscible with the above-described components, for example, styrene-maleic anhydride copolymer, styrene-acrylic acid copolymer, methacrylic acid-methylmethacrylate copolymer, and the like can be added to increase the strength of the images or for use as a binder in a manner well-known in the art.

Light-sensitive copy materials are formed by applying light-sensitive compositions comprising the aforementioned components to a suitable support. Representative supports include metal plates (e.g., an aluminium plate, a zinc plate, etc.), various paper sheets (e.g., a polyethylene film laminated paper sheet, a polystyrene film laminated paper sheet, etc.), plastic films (e.g., polyethylene terephthalate, cellulose diacetate, cellulose triacetate, nitrocellulose, polycarbonates, polyvinyl chloride films and the like), thin layers of metals or inorganic compounds (e.g., chromium, aluminium, zinc, chalcogenide compounds, etc.) formed on base plates such as the aforementioned plastic films, glass plate and the like using an evaporation technique, etc. A dry thickness of the light-sensitive layer depends upon the end-use of the copying material, but it is in general about 0.1 to 20 μm, and typically about 0.3 μm to 8 μm.

The light-sensitive copying material of the present invention can be prepared by, e.g., preparing a light-sensitive coating composition, coating the composition on a support, drying the layer coated and so on as in the preparation of conventional copying materials.

The present invention lies partly in a negative working process wherein the light-sensitive copying material prepared as described above is exposed to an imagewise pattern of light and subsequently heated, subjected to overall exposure and then development-processed with a developing solution. The procedure of exposing the copying material of the present invention to an imagewise pattern of light is performed by applying the same operations under the same conditions as have been applied to conventional light-sensitive materials utilizing o-quinonediazide compounds. As light sources for exposure xenon lamps, carbon arc lamps, tungsten lamps, metal halide lamps, ultra-high pressure mercury vapor lamps, fluorescent lamps, etc., can be employed. The exposure necessary to produce latent images efficiently is the same as for conventional light-sensitive materials containing o-quinonediazide system. Moreover, images having continuous tone can be produced by applying a halftone process to the light-sensitive materials. These techniques are all well-established and can be utilized in the processes of the present invention.

After imagewise exposure the material is heated and then exposed uniformly to light. Insolubilization of the areas exposed to light in imagewise exposure is accelerated by the heat treatment. Heating may be carried out simultaneously with imagewise exposure, or may be carried out after imagewise exposure. The copying material is heated at a temperature of at least about 300° C., preferably about 70° C. to 300° C. In the temperature range of 30° C. to 70° C. heating for a relatively long period of time is necessary. On the other hand, heating at temperatures higher than 300° C. reduces the sensitivity of unexposed portions. Therefore, heating at temperatures within the aforementioned range (i.e., 70° C. to 300° C.) is advisable. The time required for the heat treatment depends upon the heating temperature adopted. For example, a standard time for heating is about 5 to 30 minutes at 100° C., while it is about 5 to 30 seconds at 250° C. In addition, heating time depends on the composition and the thickness of a light-sensitive layer employed. Accordingly, optimum heating temperature and time should be determined for each type copying material. Various heating techniques can be applied to the present invention. For instance, the light-sensitive copying material may be placed in an atmosphere of a heated gas, dipped in a heated liquid, or allowed to stand in contact with a heated solid.

The light-sensitive copying material which has received the heat treatment is then exposed uniformly to actinic radiation. This uniform exposure is undertaken to change the areas of the light-sensitive layer corresponding to the imagewise unexposed areas so that they can be eliminated upon developing processing carried out later. Therefore, at least the unexposed areas in the above-described imagewise exposure need to be irradiated with actinic radiation. However, the areas previously exposed in the imagewise exposure have already lost their sensitivity and therefore irradiation at this stage does not give rise to any changes in these areas. Such being the case, the entire surface of the light-sensitive layer is uniformly irradiated from the standpoint of working efficiency. Application of light to the entire surface of the light-sensitive layer in an amount the same as applied to the exposed portions of the light-sensitive layer in the previous imagewise exposure is sufficient to effect this uniform exposure.

The unexposed areas are dissolved and eliminated upon developing treatment carried out after the above-described treatments. The developing solution employed for the developing treatment can be selected from many known developing solutions used in forming positive working images using conventional o-quinonediazide compounds. Namely, development can be achieved with ease by dipping the light-sensitive copying material in an alkaline solution or by washing it with an alkaline solution. Specific examples of alkaline solutions employed preferably include aqueous solutions containing sodium hydroxide, potassium hydroxide, sodium silicate, potassium silicate, sodium tertiary phosphate, potassium tertiary phosphate, sodium carbonate, potassium carbonate, etc., and basic solvents such as ethanolamine and the like. Optionally, organic solvents, surface active agents and so on can be incorporated in these developing solutions.

Processes in which the conditions required for forming the above-described negative working images coincide with the conditions required for forming positive images using o-quinonediazide systems are a preferred embodiment of the present invention. Namely, in accordance with the preferred embodiment of the present invention, the above-described light-sensitive copying materials produce positive working images by receiving in sequence imagewise exposure and development processing but also produce negative working images by receiving in sequence imagewise exposure, heat treatment, uniform exposure and development processing. The imagewise exposure undertaken for obtaining positive working images and that undertaken for obtaining negative working images are the same and further development-processing in both cases (but for the overall exposure and heat treatment) is also carried out under the same conditions. More specifically, imagewise exposure and development-processing in both the positive working and negative working processes are carried out using the same instruments or apparatus and under the same conditions, respectively.

The present invention permits formations of both positive and negative images and is of great advantage and can be utilized for various purposes.

The present invention will now be illustrated in greater detail by the following examples.

EXAMPLE 1

1.0 part by weight of 1,2-naphthoquinonediazido-5-sulfonic acid ester of polyhydroxyphenyl synthesized by condensation polymerization of acetone and pyrogallol described in Example 1 of Japanese Patent Publication No. 28403/68, 2.0 parts by weight of a phenol resin (PR-50940, produced by Sumitomo Durez Co., Ltd.; degree of polymerization: 3–10), 0.25 part by weight of the compound represented by the following formula:

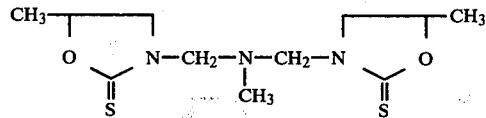

were dissolved in a mixture of 20 parts by weight of methyl ethyl ketone and 20 parts by weight of methyl cellosolve acetate, and filtered through a filter funnel having pores measuring 0.5 μm in diameter to prepare a light-sensitive solution. Further, a base plate was prepared as follows: aluminium and iron were co-evaporated to form a thin layer having a thickness of 700 Å onto a cleaned soda lime glass plate having a size of 2.5 square inches. In the evaporation process, the atomic ratio of aluminium to iron was controlled so as to be 98.5:1.5. The aforementioned light-sensitive solution was applied to the evaporated layer of the base plate using a rotary coater so that the dry thickness of the light-sensitive layer was 0.6 μm and then dried. Two light-sensitive plates were prepared according to the above-described process.

Each of these light-sensitive plates was subjected to contact exposure (imagewise exposure) for 9 seconds through a chrome mask to test for resolution by means of a 2 kw ultra-high pressure mercury vapor lamp (produced by ORC Co.) at a distance of 55 cm. The resulting two light-sensitive plates were designated Sample A and Sample B, respectively. Sample A was heated for 7 minutes at a temperature of 100° C. by placing it in an air thermostat and then cooled. Thereafter Sample A was subjected to overall exposure (after-exposure) under the same conditions as in the aforementioned imagewise exposure. Heating and overall exposure treatments were not carried out with respect to the Sample B.

The thus processed Samples A and B were dipped simultaneously in a developing solution (31° C.) prepared by dissolving 4 parts by weight of sodium hydroxide, 10 parts by weight of trisodium phosphate (12 hydrate) and 10 parts by weight of potassium bromate in 1,000 parts by weight of water. After 25 seconds, they were taken out of the developing solution, washed with water and dried. In Sample A, the portions of the light-sensitive layer and the evaporated layer corresponding to the imagewise unexposed areas were removed by dissolution, while the other portions of the light-sensitive layer and the evaporated layer corresponding to the imagewise exposed areas remained. Thus, negative working photomask images were obtained. In Sample B, contrary to the Sample A, positive working photomask images were obtained by dissolution and removal of the exposed areas of the light-sensitive layer and the evaporated layer.

In both the image portions of the photomasks formed on the Sample A and Sample B, pinholes were rarely found. In addition, fog was not observed in non-image portions and spaces between lines could be clearly resolved at a line width of 1.5 μm. As a result, the light-sensitive plate of the present invention provided images of good quality. Transmittance of the evaporated layer (mask layer) in the image portion was 3.4.

EXAMPLES 2 TO 36

Positive working and negative working photomask images, respectively, were obtained in the same manner as in Example 1 except that each of the 35 compounds illustrated in this specification hereinbefore was employed instead of the compound whose chemical structural formula was illustrated in Example 1. Each of the thus prepared light-sensitive materials was allowed to stand for 7 days under the condition of high temperature (45° C.) and humidity (75% RH). However, developability of each material was not affected by such conditions, and was excellent. In case that ethanolamine was used instead of the aforementioned compounds, remarkable deterioration in developability was observed after storage for 7 days under the same conditions described above.

EXAMPLE 37

1 part by weight of ester obtained in the same manner as in Example 1, 2 parts by weight of phenol resin PR-50940, 0.15 part by weight of the compound represented by the following formula:

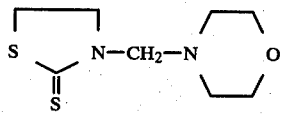

and 0.03 part by weight of Cil Blue (produced by Orient Chemical Industry Co., Ltd.) were dissolved in a mixture of 10 parts by weight of methyl ethyl ketone and 20 parts by weight of methyl cellosolve acetate. The thus obtained light-sensitive solution was applied to a grained aluminium plate having a thickness of 0.24 mm using a rotary coater, and dried for about 2 minutes at a temperature of 100° C. The dry coverage of the light-sensitive layer was 20 g/m². The thus obtained light-sensitive plate was cut into two plates. One plate was exposed through a positive original for 1 minute by means of a 2 kw metal halide lamp (produced by Fuji Photo Film Co., Ltd.) at a distance of 1 meter and then dipped in a 4% aqueous solution of sodium silicate for a period of about 1 minute, resulting in the formation of excellent image. The other plate was exposed for 1 minute through a negative original by means of a 2 kw metal halide lamp at a distance of 1 meter, heated at 120° C. for 7 minutes and further subjected to overall exposure for 1 minute by means of a 2 kw metal halide lamp at a distance of 1 meter. Then, the light-sensitive plate which received overall exposure was dipped in a 4% aqueous solution of sodium silicate for a period of about 1 minute to produce images of good quality. These two negative working and positive working printing plates provided excellent printed copies using an offset printing technique.

While the invention has been described in detail and with reference to specific embodiments thereof, it will be apparent to one skilled in the art that various changes and modifications can be made therein without departing from the split and scope thereof.

What is claimed is:

1. A negative working process for forming images which comprises imagewise exposing to light a light-sensitive material comprising a support having thereon a light-sensitive layer containing an o-quinonediazide compound and a compound represented by the formula (I):

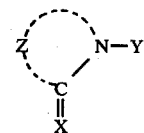

wherein Z represents the nonmetallic atoms forming a 5-membered ring; X represents

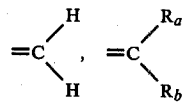

where $R_a$ and $R_b$ are an organic group other than a carboxylic acid or $=N-R_c$ where $R_c$ is a hydrogen atom or an organic group other than a carboxylic acid group, and Y is a hydrogen atom or an organic group other than a carboxylic acid group to insolubilize the areas of said layer exposed to light, heating said imagewise exposed material simultaneously with or immediately following said imagewise exposing to accelerate the insolubilization of the areas of said layer exposed to light, uniformly exposing said heated material to actinic radiation, and developing said material in alkaline solution to remove only the imagewise unexposed areas of said layer.

2. The process of claim 1, wherein said heat treatment is conducted at a temperature of at least about 30° C.

3. The process of claim 1, wherein said heat treatment is conducted at a temperature of about 70° to 300° C.

4. The process of claim 1, wherein said alkaline solution is an aqueous alkaline solution.

5. The process of claim 1, wherein Y is a hydrogen atom, an alkyl group, a hydroxyalkyl group, an aryl group, an aralkyl group, a pyridyl group, a pyridylmethyl group, a piperidinomethyl group, a morpholinomethyl group, an amino group, a disubstituted amino group or an amido group.

6. The process of claim 1, wherein $R_a$, $R_b$ and $R_c$ are each an alkyl group, a hydroxyalkyl group, an aryl group, an aralkyl group, a pyridyl group, a pyridylmethyl group, a piperidinomethyl group, a morpholinomethyl group, an amino group, a disubstituted amino group or an amido group.

7. The process of claim 1, wherein Z forms a ring selected from the group consisting of 1,3-oxazolane, Δ⁴-1,3-oxazoline, 1,3-oxathiolane, 1-thia-3-azaindane, Δ⁴-1,3-thiazoline, Δ²-1,3,4-thiadiazoline, imidazolidine, benzo[d]imidazoline, pyrrolidine, benzo[b]pyrroline, pyrazolidine, 2-pyrazoline, 3-pyrazoline, and 1-oxa-3-azaindane.

* * * * *